United States Patent [19]
Wellnitz et al.

[11] Patent Number: 5,177,376
[45] Date of Patent: Jan. 5, 1993

[54] ZERO TEMPERATURE COEFFICIENT COMPARATOR CIRCUIT WITH HYSTERESIS

[75] Inventors: Keith M. Wellnitz, Tempe; Randall T. Wollschlager, Chandler, both of Ariz.

[73] Assignee: Motorola, Inc., Schaumburg, Ill.

[21] Appl. No.: 819,256

[22] Filed: Jan. 10, 1992

[51] Int. Cl.⁵ .............................. H03K 3/29
[52] U.S. Cl. .................... 307/290; 307/359
[58] Field of Search ........... 307/290, 359, 491, 310

[56] References Cited
U.S. PATENT DOCUMENTS

| | | | |
|---|---|---|---|
| 4,687,954 | 8/1987 | Yasuda et al. | 307/290 X |
| 4,864,164 | 9/1989 | Ohshima et al. | 307/290 X |
| 4,939,394 | 7/1990 | Hashimoto | 307/290 X |
| 5,034,623 | 7/1991 | McAdams | 307/290 |

Primary Examiner—William L. Sikes
Assistant Examiner—Toan Tran
Attorney, Agent, or Firm—Bradley J. Botsch

[57] ABSTRACT

A single ended input comparator circuit having an input inverter stage and a voltage reference circuit is provided. The voltage reference circuit modulates the voltage appearing across the inverter stage thereby varying the switching threshold voltage level of the inverter stage and providing hysteresis for the comparator circuit. Further, by appropriately choosing the widths and lengths of the transistors used in the inverter stage and the voltage reference circuit, a zero temperature coefficient for the comparator circuit is achieved.

3 Claims, 1 Drawing Sheet

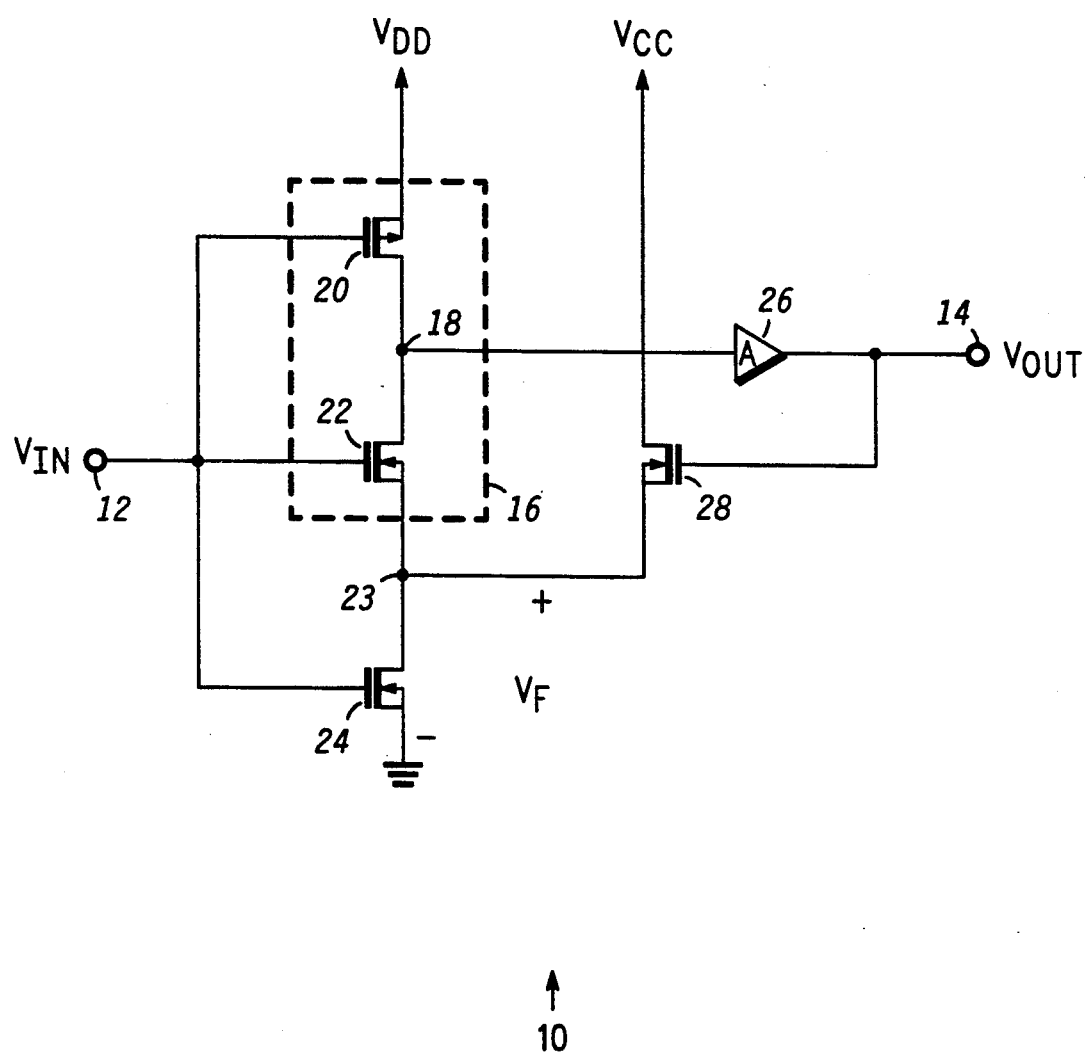

ZERO TEMPERATURE COEFFICIENT COMPARATOR CIRCUIT WITH HYSTERESIS

FIELD OF THE INVENTION

This invention relates to circuits and, in particular, to comparator circuits having hysteresis.

BACKGROUND OF THE INVENTION

A comparator circuit with hysteresis is a comparator with two switching threshold levels: an upper switching voltage level and a lower switching voltage level wherein the upper voltage level is greater than the lower voltage level. In particular, if the previous output logic state of the comparator was a logic low, the comparator switches logic states when the input voltage exceeds the upper threshold voltage level. However, if the previous output logic state of the comparator was a logic high, the comparator switches logic states when the input voltage falls below the lower threshold voltage level. It is in this manner that hysteresis is achieved as is understood.

It is also desirable to provide a comparator with hysteresis whose switching voltage levels are independent of temperature. A typical circuit for providing a zero temperature coefficient comparator circuit with hysteresis is disclosed in a textbook entitled "Bipolar and MOS Analog Integrated Circuit Design" by Alan B. Grebene, John Wiley & Sons, 1984. In particular, FIG. 11.15 on page 559 shows a circuit for adjusting the voltage at the inverting input of the comparator by closing switch $S_2$ to short out resistor $R_C$ in order to provide the lower switching threshold. However, this circuit includes a large number of devices, consumes a large die size area, and requires a current bias.

Hence, there exists a need for an improved zero temperature coefficient comparator circuit having hysteresis.

SUMMARY OF THE INVENTION

Briefly, there is provided a comparator circuit having an input terminal and an output terminal, comprising an inverter circuit having an input and an output, the input of the inverter circuit being coupled to the input terminal of the comparator circuit, the inverter circuit being coupled to operate between a voltage appearing at a first supply terminal and a voltage appearing at a first circuit node; a voltage reference circuit being responsive to a logic signal appearing at the output terminal of the comparator circuit and being coupled between a second supply voltage terminal and the first circuit node for modulating the voltage appearing across the inverter circuit; and an amplifier circuit coupled between the output of said inverter circuit and the output terminal of the comparator circuit.

The present invention will be better understood from the following detailed description taken in conjunction with the accompanying drawing.

BRIEF DESCRIPTION OF THE DRAWING

The sole FIGURE is a partial schematic/block diagram of a zero temperature coefficient comparator circuit with hysteresis.

DETAILED DESCRIPTION OF THE DRAWING

Referring to the sole FIGURE, there is illustrated a partial schematic/block diagram of comparator circuit 10 having input terminal 12 and output terminal 14. The comparator circuit includes inverter 16 having an input coupled to terminal 12 and an output which can be taken at circuit node 18. It is understood that inverter 16 forms the input stage of comparator circuit 10.

Inverter 16 includes PMOS transistor 20 and NMOS transistor 22 where PMOS transistor 20 has a source electrode coupled to a first supply voltage terminal at which the operating potential VDD is applied, and a gate electrode coupled to input terminal 12. The drain electrode of PMOS transistor 20 is coupled to the drain electrode of NMOS transistor 22 wherein the common drain electrodes form the output of inverter 16 at circuit node 18. The gate electrode of NMOS transistor 22 is coupled to input terminal 12, while the source electrode of NMOS transistor 22 is coupled to circuit node 23. The back gate electrodes of transistors 20 and 22 are respectively coupled to the source electrodes of transistors 20 and 22.

Transistors 24 and 28 provide the internal reference and hysteresis of comparator circuit 10. The drain electrode of NMOS transistor 24 is coupled to circuit node 23 and to the source electrode of NMOS transistor 28, while the gate electrode of NMOS transistor 24 is coupled to input terminal 12. The source electrode of NMOS transistor 24 is returned to ground. The drain electrode of NMOS transistor 28 is coupled to operating $V_{CC}$, while the gate electrode of the same is coupled to output terminal 14. Also, the back gate electrodes of transistors 24 and 28 are respectively coupled to the source electrodes of transistors 24 and 28.

In addition, amplifier 26 has an input coupled to circuit node 18, and an output coupled to output terminal 14. Also, voltage $V_F$ is substantially equal to the voltage appearing at circuit node 23.

The switching threshold voltage level (trip point) of inverter 16, which is determined by the widths and lengths of transistors 20 and 22, are set to be a fraction of the voltage appearing across the source electrode of transistor 20 and the source electrode of transistor 22. Or equivalently, a fraction of voltage difference between voltage $V_{DD}$ and the voltage appearing at circuit node 23 ($V_{23}$). For example, the switching threshold voltage level of inverter 16 may be set to be the midpoint voltage between $V_{DD}$ and $V_{23}$ which can be expressed as $(V_{DD}-V_{23})/2$.

The present invention recognizes that by varying the voltage appearing at circuit node 23 ($V_F$), the switching threshold voltage level of inverter 16 can be correspondingly varied. As a result, upper and lower switching threshold voltage levels can be provided thereby providing hysteresis for comparator circuit 10.

Initially, assume a starting position of voltage $V_{IN}$ being higher than upper input threshold voltage and voltage $V_{OUT}$ correspondingly being a logic low voltage. In this case, NMOS transistor 28 will be rendered inoperative and the voltage at circuit node 23 will be substantially equal to zero volts. This sets inverter 16 to switch at a threshold level substantially equal to $V_{DD}/2$ which is known as the lower threshold voltage level ($V_L$). Therefore, as voltage $V_{IN}$ falls below voltage $V_L$, inverter 16 switches and voltage $V_{OUT}$ transitions from a logic low voltage level to a logic high voltage level thereby turning on NMOS transistor 28. Once transistor 28 turns on, transistors 28 and 24 form a voltage divider with respect to voltage $V_{CC}$ which forces a predetermined voltage at circuit node 23 as denoted by voltage $V_F$. Thus, the voltage appearing at circuit node 23 has increased from substantially zero volts to voltage $V_F$ wherein voltage $V_F$ is determined by the size ratio of transistors 28 and 24. This now sets a new switching threshold voltage level for inverter 16 which is known as the upper threshold level ($V_U$). It is understood that because the voltage at circuit node 23 has increased, voltage $V_U$ is greater than voltage $V_L$. As a result, hysteresis is achieved for comparator circuit 10 because now voltage $V_{IN}$ must exceed voltage $V_U$ (not voltage $V_L$) in order to cause the output of inverter 16 to switch from a logic high state to a logic low state.

Moreover, if voltage $V_{IN}$ increases and exceeds voltage $V_U$, inverter 16 switches and voltage $V_{OUT}$ transitions from a logic high voltage level to a logic low voltage level thereby turning off NMOS transistor 28. Once transistor 28 turns off, the voltage at circuit node 23 is substantially equal to zero volts and comparator circuit 10 is now set back to switch at its lower threshold voltage level ($V_L$) as aforedescribed.

It is worth noting that amplifier 26 substantially gains up the voltage occurring at circuit node 18 thereby holding the gate of NMOS transistor 28 to a high voltage ($V_{DD}$) when the voltage appearing at circuit node 18 is near voltage $V_L$.

In summary, the voltage appearing at circuit node 23 is modulated between a first voltage (ground reference) and a second voltage ($V_F$) to vary the switching threshold voltage level of inverter 16. This, in turn, provides the necessary hysteresis for comparator circuit 10.

A detailed analytical approach for determining voltages $V_L$, $V_U$ and $V_F$ is now presented.

Solving first for the lower trip point ($V_L$):

$$\text{let } I_{DS20} = I_{DS22}$$

Therefore, we obtain:

$$(W20/L20)*(k_p/2)*(V_{DD} - V_{IN} - V_{Tp})^2 = (W22/L22)*(k_n/2)*(V_{IN} - V_{Tn})^2$$

where
- $W_{20}$ and $W_{22}$ are respectively the widths of transistors 20 and 22;
- $L_{20}$ and $L_{22}$ are respectively the lengths of transistors 20 and 22;
- $V_{Tp}$ is the threshold voltage for PMOS transistor 20;
- $V_{Tn}$ is the threshold voltage for NMOS transistor 20; and
- $k_p$ and $k_n$ are respectively the transconductance parameters for PMOS transistor 20 and NMOS transistor 22.

Now let $\beta = \{(W22/W20)*(L20/L22)*(k_n/k_p)\}^{\frac{1}{2}}$ and $V_L = V_{IN}$ We then can obtain the following expression for $V_L$:

$$V_L = (V_{DD} - V_{Tp} - V_{Tn}*\beta)/(\beta - 1) \qquad (1)$$

Similarly, solving for the upper trip point ($V_U$):

$$\text{let } I_{DS20} = I_{DS22}$$

Therefore, we obtain:

$$(W20/L20)*(k_p/2)*(V_{DD} - V_{IN} - V_{Tp})^2 = (W22/L22)*(k_n/2)*(V_{IN} - V_F - V_{Tn})^2$$

Again, let $\beta = \{(W22/W20)*(L20/L22)*(k_n/k_p)\}^{\frac{1}{2}}$ and $V_U = V_{IN}$ We then can obtain the following expression for $V_U$:

$$V_U = (V_{DD} - \beta*V_F - V_{Tp} - \beta*V_{Tn})/(\beta - 1) \qquad (2)$$

Notice that the hysteresis voltage ($V_{HYS}$) is the difference between the upper and lower switching threshold voltage levels and can be expressed as:

$$V_{HYS} = V_U - V_L = \beta*V_F/(\beta - 1)$$

The feedback voltage ($V_F$) is determined as follows:

By design $I_{DS28} >> I_{DS26} = I_{DS22}$ and thus $I_{DS24} \approx I_{DS28}$ Therefore, we obtain:

$$(W24/L24)*(k_n/2)*(V_{IN} - V_{Tn})^2 = (W28/L28)*(k_n/2)*(V_{OUT} - V_F - V_{Tn})^2$$

Let $\alpha = \{(W24/W28)*(L28/L24)\}^{\frac{1}{2}}$ and $V_{IN} = V_U$

Thus $V_F = \{V_{OUT} - V_U - V_{Tn}(\alpha - 1)\}/\alpha \qquad (3)$

Now, equating EQNS. (2) and (3), we obtain:

$$(V_{DD} - \beta*V_F - V_{Tp} - \beta*V_{Tn})/(\beta - 1) = \{V_{OUT} - V_U - V_{Tn}(\alpha - 1)\}/\alpha$$

Further, for $V_{IN} = V_U + \epsilon$ (where $\epsilon$ is some small but finite voltage and, thus, voltage $V_{IN}$ is near the upper switching threshold voltage level), we obtain (due to amplifier 26) that $V_{OUT} \approx V_{DD}$.

Finally, we can obtain the following expression for $V_F$:

$$V_F = \{V_{DD}*(1 - \beta - \alpha) - V_{Tp}*(\alpha - \beta - 1) - \alpha*V_{Tn}\}/(\alpha*\beta - \beta - 1) \qquad (4)$$

It should be realized that the terms $k_n$, $k_p$, $V_{Tn}$ and $V_{Tp}$ are sensitive to temperature variations. However, for a complementary MOS process wherein $V_{Tn} \approx V_{Tp}$, temperature variations can be eliminated by scaling the widths and lengths of MOS transistors 20, 22, 24 and 28 to appropriately select the values of $\alpha$ and $\beta$.

For example, let $V_{Tn} \approx V_{Tp}$ and by design establish $\alpha = \beta = 1$;

The following circuit characteristics are then obtained:

$$V_L = V_{DD}/2$$

$$V_U = V_{DD}*\tfrac{2}{3}$$

$$V_F = V_{DD}/3$$

$$V_{HYS} = V_F/2 = V_{DD}/6$$

From the above equations and analysis, it is clear that voltages $V_L$, $V_U$, $V_F$ and $V_{HYS}$ are all functions of voltage $V_{DD}$ and are all independent of temperature under the assumption that voltage $V_{DD}$ is independent of temperature. Thus, a zero temperature coefficient comparator circuit with hysteresis has been provided.

By now it should be apparent from the foregoing discussion that a novel comparator circuit has been provided. The single ended input comparator circuit includes an input inverter stage and an internal voltage reference circuit. The internal voltage reference circuit modulates the voltage appearing across the inverter stage thereby varying the switching threshold voltage level of the inverter stage and providing hysteresis for the comparator circuit. Further, by appropriately choosing the widths and lengths of the transistors used in the inverter stage and the internal voltage reference circuit, a zero temperature coefficient for the comparator circuit is achieved.

While the invention has been described in conjunction with the specific embodiments thereof, it is evident that many alterations, modifications and variations will be apparent to those skilled in the art in the light of the foregoing description. Accordingly, it is intended to embrace all such alterations, modifications and variations in the appended claims.

We claim:

1. A comparator circuit having an input terminal and an output terminal, comprising:
   an inverter circuit having an input and an output, said input of said inverter circuit being coupled to the input terminal of the comparator circuit, said inverter circuit being coupled to operate between a voltage appearing at a first supply voltage terminal and a voltage appearing at a first circuit node, said inverter circuit including:
   (a) a first PMOS transistor having drain, source, gate and backgate electrodes, said source and backgate electrodes of said first PMOS transistor being coupled to said first supply voltage terminal, said gate electrode of said first PMOS transistor being coupled to said input of said inverter circuit, and said drain electrode of said first PMOS transistor being coupled to said output of said inverter circuit; and
   (b) a first NMOS transistor having drain, source, gate and backgate electrodes, said drain electrode of said first NMOS transistor being coupled to said drain electrode of said first PMOS transistor, said gate electrode of said first NMOS transistor being coupled to said input of said inverter circuit, said source and backgate electrodes of said first NMOS transistor being coupled to said first circuit node;
   a voltage reference circuit being responsive to a logic signal appearing at the output terminal of the comparator circuit and being coupled between a second supply voltage terminal and said first circuit node for modulating the voltage appearing across said inverter circuit, said voltage reference circuit including:
   (a) a second NMOS transistor having a drain, source, gate and backgate electrodes, said drain electrode of said second NMOS transistor being coupled to said first circuit node, said gate electrode of said second NMOS transistor being coupled to the input terminal of the comparator circuit, and said source and backgate electrodes of said second NMOS transistor being coupled to a third supply voltage terminal; and
   (b) a third NMOS transistor having drain, source, gate and backgate electrodes, said drain electrode of said third NMOS transistor being coupled to said second supply voltage terminal, said gate electrode of said third NMOS transistor being coupled to the output terminal of the comparator circuit, and said source and backgate electrodes of said third NMOS transistors being coupled to said first circuit node;
   an amplifier circuit coupled between said output of said inverter circuit and the output terminal of the comparator circuit; and
   said first, second and third NMOS transistors and said first PMOS transistor having appropriate lengths and widths such that the comparator circuit has a temperature coefficient substantially equal to zero.

2. A comparator circuit having an input terminal and an output terminal, comprising:
   a first PMOS transistor having drain, source, gate and backgate electrodes, said source and backgate electrodes of said first PMOS transistor being coupled to a first supply voltage terminal, said gate electrode of said first PMOS transistor being coupled to the input terminal;
   a first NMOS transistor having drain, source, gate and backgate electrodes, said drain electrode of said first NMOS transistor being coupled to said drain electrode of said first PMOS transistor, said gate electrode of said first NMOS transistor being coupled to the input terminal, said source and backgate electrodes of said first NMOS transistor being coupled to a first circuit node;
   a second NMOS transistor having a drain, source, gate and backgate electrodes, said drain electrode of said second NMOS transistor being coupled to said first circuit node, said gate electrode of said second NMOS transistor being coupled to the input terminal, and said source and backgate electrodes of said second NMOS transistor being coupled to a second supply voltage terminal;
   a third NMOS transistor having drain, source, gate and backgate electrodes, said drain electrode of said third NMOS transistor being coupled to a third supply voltage terminal, said gate electrode of said third NMOS transistor being coupled to the output terminal, and said source and backgate electrodes of said third NMOS transistors being coupled to said first circuit node, said first, second and third NMOS transistors and said first PMOS transistor having appropriate lengths and widths such that the comparator circuit has a temperature coefficient substantially equal to zero; and
   an amplifier circuit coupled between said drain electrode of said first NMOS transistor and said gate electrode of said third NMOS transistor.

3. A method for providing a zero temperature coefficient comparator circuit having hysteresis, the comparator circuit including an inverter input stage and a voltage reference circuit wherein both the inverter input stage and the reference circuit includes a plurality of transistors, the method comprising the steps of:
   (a) modulating a voltage appearing across the inverter input stage such that a switching threshold voltage level of said inverter input stage is varied; and
   (b) selecting the widths and lengths of the transistors used in the inverter input stage and the voltage reference circuit such that said switching threshold voltage level of said inverter input stage is substantially independent of temperature.

* * * * *